United States Patent [19]

Kamon

[11] Patent Number: 5,321,493
[45] Date of Patent: Jun. 14, 1994

[54] APPARATUS AND METHOD FOR EVALUATING A PROJECTION LENS

[75] Inventor: Kazuya Kamon, Itami, Japan

[73] Assignee: Mitsubishi Denki Kabushiki Kaisha, Tokyo, Japan

[21] Appl. No.: 974,075

[22] Filed: Nov. 10, 1992

[30] Foreign Application Priority Data

Jan. 23, 1992 [JP] Japan .................................. 4-10164

[51] Int. Cl.$^5$ .............................................. G01B 9/00
[52] U.S. Cl. ............................................... 356/124
[58] Field of Search .............. 356/124, 125, 124.5, 356/126, 127, 121, 399–401; 355/53; 359/649; 250/548, 201.1, 201.2, 201.3

[56] References Cited

U.S. PATENT DOCUMENTS

| | | | |
|---|---|---|---|
| 4,585,342 | 4/1986 | Lin et al. ............................ | 356/124 |
| 4,759,626 | 7/1988 | Kroko ................................. | 356/124 |
| 4,929,083 | 5/1990 | Brunner .............................. | 356/400 |

FOREIGN PATENT DOCUMENTS 084025  4/1988  Japan ................................... 356/124

Primary Examiner—Richard A. Rosenberger
Assistant Examiner—Hoa Q. Pham
Attorney, Agent, or Firm—Leydig Voit & Mayer

[57] ABSTRACT

An apparatus for evaluating a projection lens has a light source, a condenser lens, a half mirror, a mask having focus test patterns in each of which light-blocking members and light-transmitting portions are alternatingly arranged, and a reflecting member such as a wafer. A driving unit moves the half mirror along the surface of the mask to select a focus test pattern. A sensor detects the quantity of light reflected by the half mirror. The quantity of light transmitted through a focus test pattern and a projection lens to be evaluated, reflected by the reflecting member, and transmitted through the projection lens and the focus test pattern is detected using the half mirror and the sensor to determine the best focus position. The best focus position for each of the focus test patterns is determined to obtain a distribution of the best focus positions.

8 Claims, 10 Drawing Sheets

APPARATUS AND METHOD FOR EVALUATING A PROJECTION LENS

BACKGROUND OF THE INVENTION

1. Field of the Invention

The present invention relates to an apparatus and a method for evaluating a projection lens and, more particularly, to an apparatus and a method for evaluating the curvature of the image field of a projection lens.

2. Description of the Related Art

FIG. 11 illustrates a known projection-exposure apparatus used in the production process for LSIs. The light emitted from a light source 11, such as a mercury lamp, travels through a condenser lens 12 to strike a mask 13 which has a circuit pattern of a chip thereon. The light transmitted through the mask 13 travels through a projection lens 14 to strike a wafer 15 so that the circuit pattern of the mask 13 is projected on the wafer 15. The circuit pattern is thus projected and transferred.

To project a fine and minute circuit pattern with high precision in this projection-exposure apparatus, the imaging plane of the projection lens 14 must be very flat. If the projection lens has a lens forming error such as tilting or curvature of the image field, the best focus position is not achieved in some locations so that the projection cannot be made onto the entire image field with the best focus.

According to the conventional art, the curvature of the image field of the projection lens 14 is evaluated as follows. As the wafer 15 is successively moved a predetermined distance at time intervals along the optical path, the wafer 15 is sequentially exposed to test patterns 16a to 16g as shown in FIG. 12. After the wafer 15 is developed, i.e., after patterns 17a to 17g corresponding to the test patterns 16a to 16g are formed on the wafer 15 as shown in FIG. 13, the patterns 17a to 17g are observed with a microscope. The best shaped pattern is selected from the patterns 17a to 17g as the best focus pattern. The position of the wafer 15 when exposed to the test pattern corresponding to the best shaped pattern is determined as the best focus position. In FIG. 13, the pattern 17c is determined as the best shaped pattern. In this way, the best focus positions are determined with respect to many locations in a chip on the wafer 15 which is exposed to the circuit pattern on the mask 13. The distribution of the best focus positions in a chip is examined to evaluate the curvature of the image field of the projection lens 14.

As described above, the image field of the projection lens 14 is evaluated by exposing wafer 15 to the test patterns 16a to 16g, developing the wafer 15, observing the patterns 17a to 17g with an optical microscope, an electron microscope or the like to determine the best focus positions with respect to many locations in a chip. Thus, evaluation of a projection lens according to the conventional art requires a lot of steps and time.

SUMMARY OF THE INVENTION

The present invention is intended to solve the above-described problems of the conventional art. Accordingly, an object of the present invention is to provide an apparatus and a method for evaluating a projection lens, in which a projection lens can be evaluated easily and precisely.

To achieve the above objects, according to one aspect of the present invention, there is provided an apparatus for evaluating a projection lens, comprising: a light source for emitting light; a mask having on substantially the entire surface thereof a plurality of focus test patterns in each of which light-blocking portions and light-transmitting portions are alteratingly arranged; a condenser lens for condensing light emitted from the light source onto the mask so that the light transmitted through the mask strikes a projection lens to be evaluated; reflecting means for reflecting the light condensed by the projection lens so that the reflected light strikes the projection lens again; a half mirror for reflecting the light which has been transmitted through a focus test pattern selected from the focus test patterns, reflected by the reflecting means and transmitted again by the selected focus test pattern; driving means for moving the half mirror along the surface of the mask to a position in accordance with a selected focus test pattern; and a sensor for detecting the quantity of light reflected by the half mirror.

According to another aspect of the present invention, there is a method for evaluating a projection lens, comprising the steps of: irradiating with light the entire surface of a mask having a plurality of patterns in each of which light-blocking portions and light-transmitting portions are alternately arranged, the light transmitted through each of the focus test patterns traveling through a projection lens to strike and be reflected from a projection surface and the light reflected from the projection surface travelling through the projection lens and the same focus test pattern; and finding the distribution of best focus positions by detecting the quantities of light transmitted through the focus test patterns twice.

DESCRIPTION OF THE PREFERRED EMBODIMENTS

The preferred embodiments of the present invention will be described hereinafter with reference to the drawings.

Figure 1:
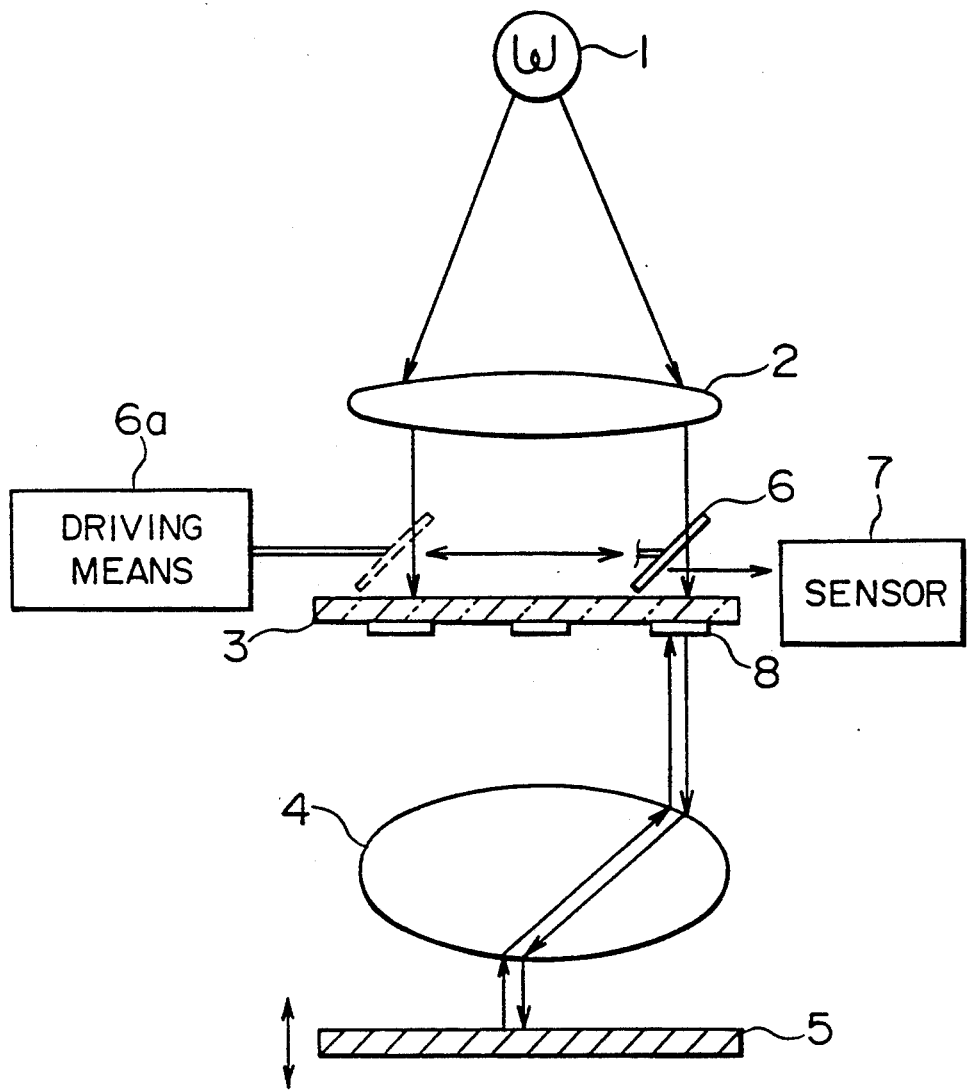
FIG. 1 illustrates an optical system of an apparatus for evaluating a projection lens, according to one embodiment of the present invention.

Referring to FIG. 1, in the optical system of an apparatus for evaluating a projection lens according to an embodiment of the present invention, a light source 1, such as a mercury lamp, is provided in a top portion of the optical system. A condenser lens 2, a mask 3, a projection lens 4 to be evaluated and a wafer 5 which also serves as a reflecting means are provided in that order from the light source 1 at the top. A half mirror 6 is placed diagonally between the condenser lens 2 and the mask 3. A sensor 7 is provided to the side of the half mirror 6. The half mirror 6 is moved along the surface of the mask 3 by a driving means 6a.

Figure 2:
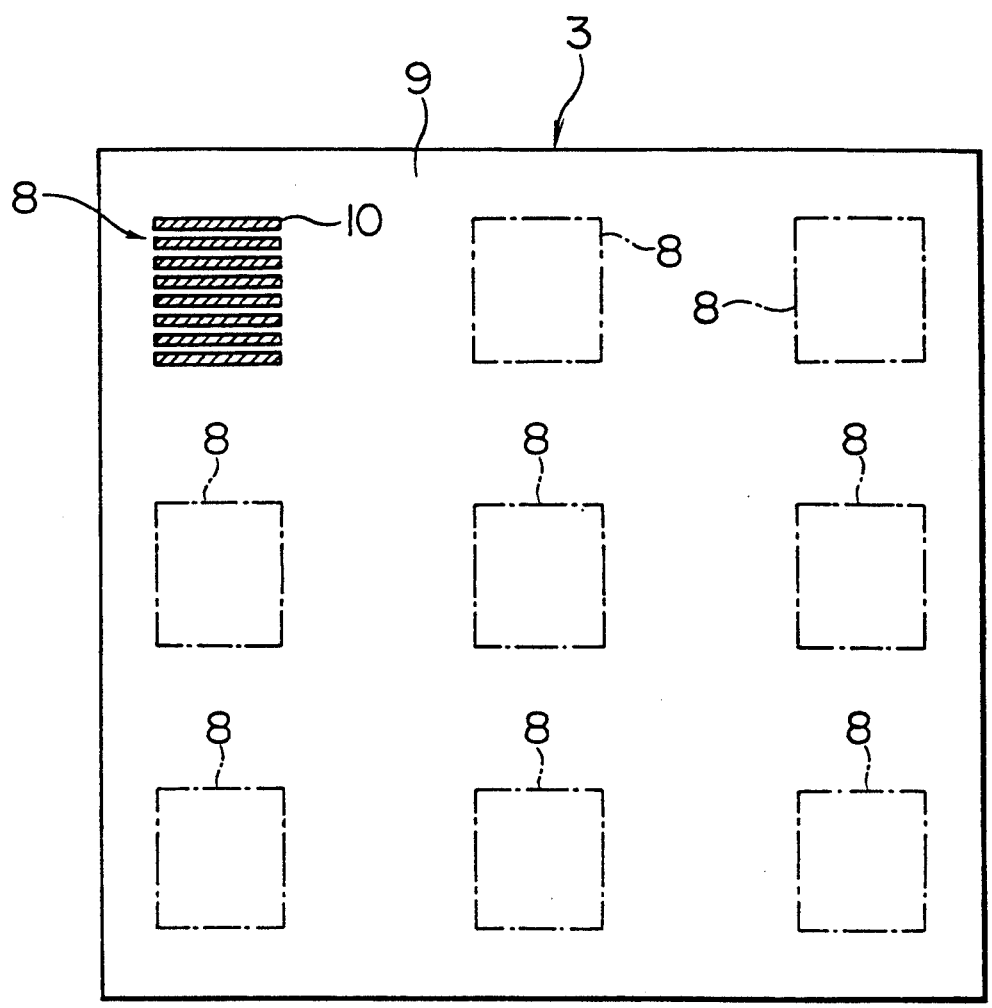
FIG. 2 is a plan view of a mask used in the apparatus for evaluating a projection lens according to the above embodiment of the present invention.
Figure 3:
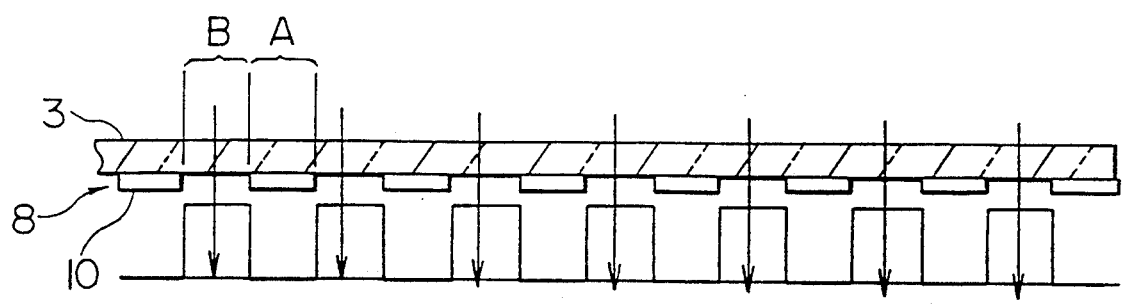
FIG. 3 illustrates the operation of the apparatus for evaluating a projection lens in the best focus state, according to the above embodiment.

As shown in FIG. 2, the mask 3 has a transparent substrate 9 and many patterns 8 for focus tests which are distributed over substantially the entire surface of the transparent substrate 9. Each of the patterns 8 has a plurality of light blocking members 10 which are parallelly arranged at a predetermined pitch. Thus, a pattern is formed in which light-blocking portions A and light-transmitting portions B are alternatingly arranged as shown in FIG. 3.

The operation of this embodiment will be described. The light emitted by the light source 1 travels through the condenser lens 2 to strike the entire surface of the mask 3. The light transmitted through the focus test patterns 8 travels through the projection lens 4 to strike the wafer 5. The light reflected from the surface of the wafer 5 travels through the projection lens 4 again and further travels upward through the focus test patterns 8 of the mask 3. One focus test pattern 8 is chosen for detecting the quantity of light transmitted upward through the focus test pattern 8. The half mirror 6 is moved by the driving means 6a to a position directly above the chosen focus test pattern 8. Thus, the light coming up through the pattern 8 is reflected by the half mirror 6 to strike the sensor 7, which detects the light quantity.

Figure 4:
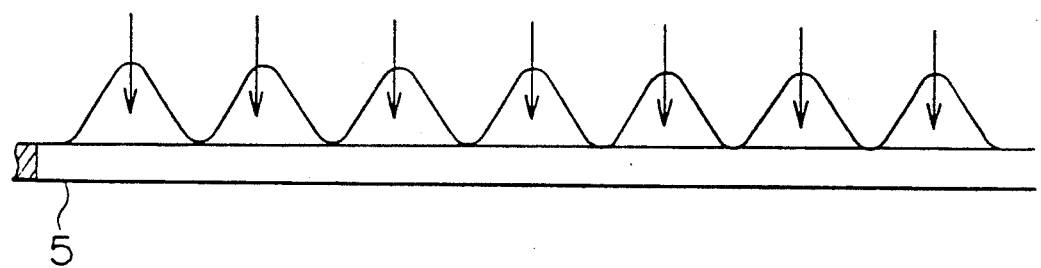
FIG. 4 illustrates the operation of the apparatus for evaluating a projection lens in the best focus state, according to the above embodiment.
Figure 5:
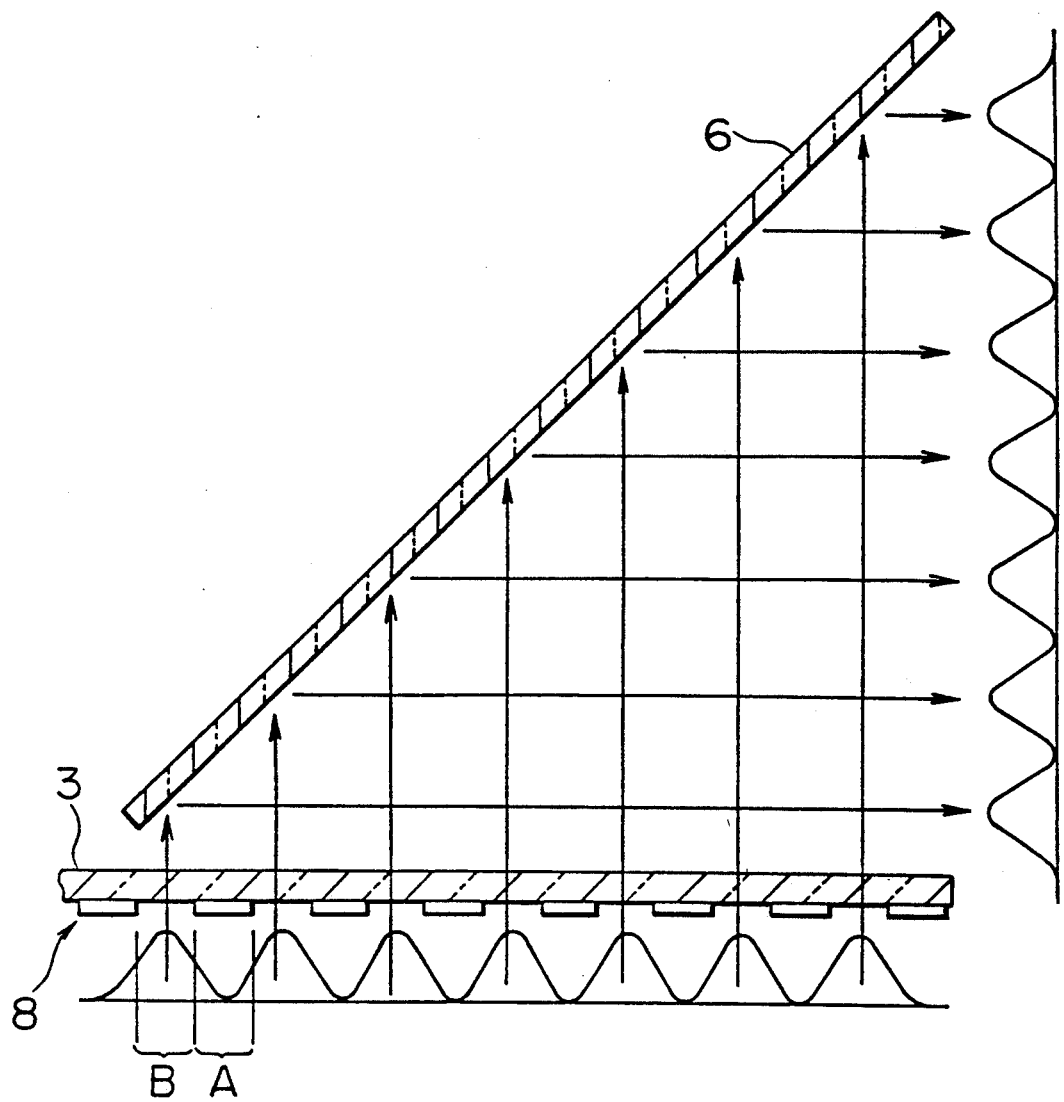
FIG. 5 illustrates the operation of the apparatus for evaluating a projection lens in the best focus state, according to the above embodiment.

The states of the light travelling in the optical system will be described in detail with reference to FIGS. 3 to 8. As shown in FIG. 3, the light immediately after being transmitted though the focus test patterns 8 of the mask 3 exhibits an amplitude distribution pattern having a rectangular waveform due to the light-blocking portions A and the light-transmitting portions B which are alternatingly arranged. By the time the light travelling through the projection lens 4 reaches the wafer 5, the amplitude distribution pattern of the light degenerates into a sine-curve waveform. The best focus state provides a large amplitude of the sine-curve waveform as shown in FIG. 4. The light as shown in FIG. 4 is reflected by the surface of the wafer 5 and travels through the projection lens 4 to reach the focus test patterns 8 of the mask 3. As shown in FIG. 5, the light reflected from the wafer 5 goes upward through the focus test patterns 8. Because the degeneration of the amplitude distribution pattern of the reflected light is minimal in the best focus state, a large quantity of the light is transmitted through the transmitting portions B of the focus test patterns 8. Thus, a large quantity of the light reaches the sensor 7, travelling via the chosen focus test pattern 8 and the half mirror 6 if the best focus state is obtained.

Figure 6:
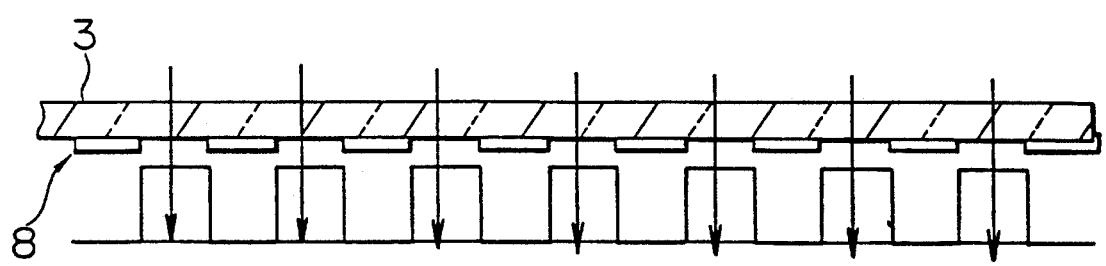
FIG. 6 illustrates the operation of the apparatus for evaluating a projection lens in a defocus state, according to the above embodiment.
Figure 7:
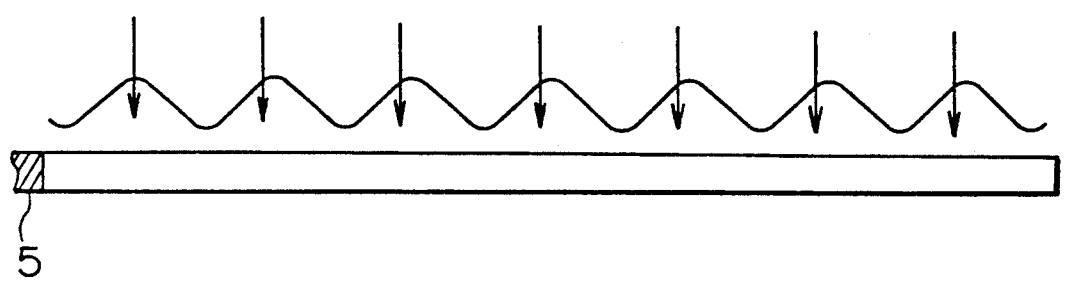
FIG. 7 illustrates the operation of the apparatus for evaluating a projection lens in a defocus state, according to the above embodiment.
Figure 8:
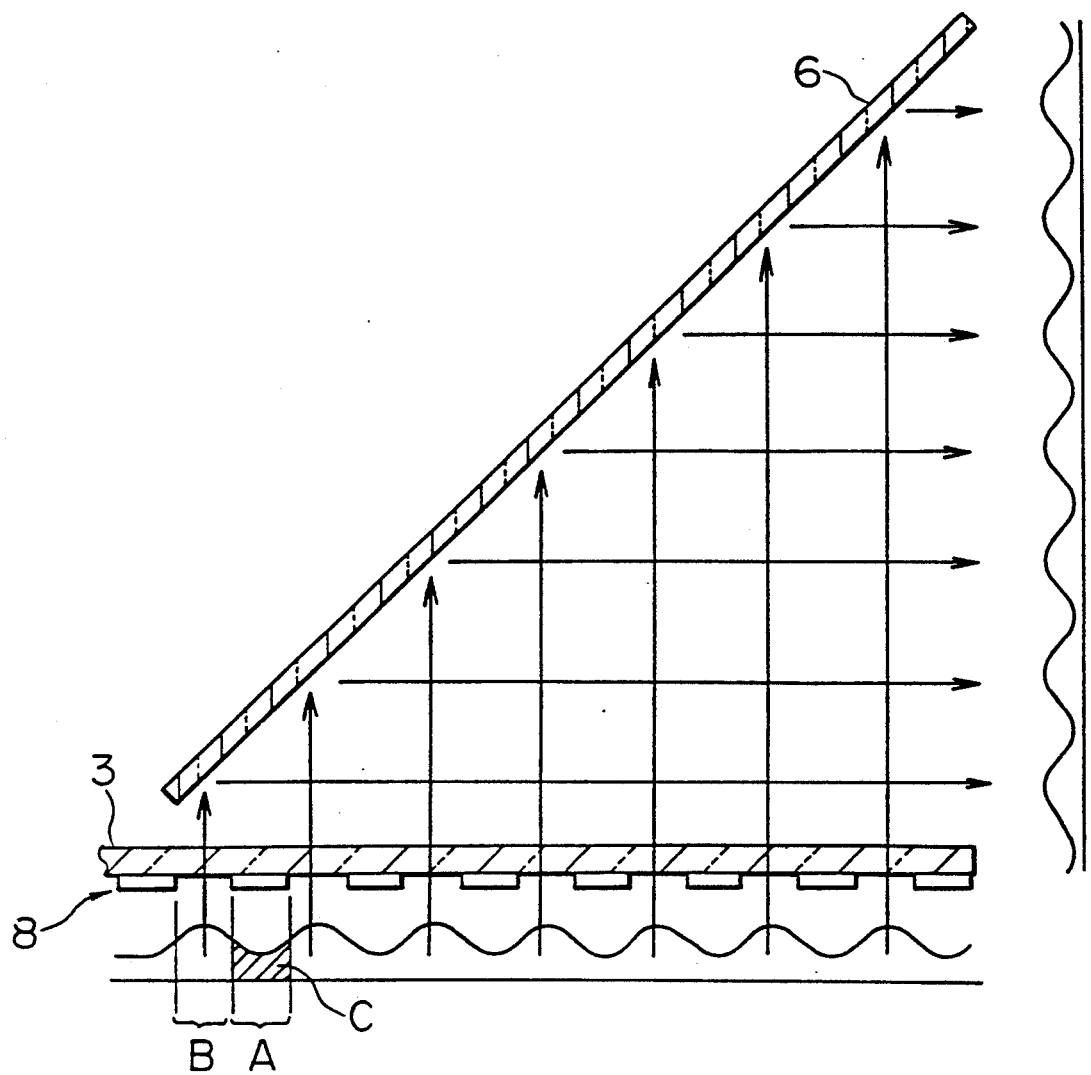
FIG. 8 illustrates the operation of the apparatus for evaluating a projection lens in a defocus state, according to the above embodiment.

On the other hand, in the defocus state, though the light immediately after being transmitted through the focus test patterns 8 of the mask 3 has an amplitude distribution pattern with a rectangular waveform as shown in FIG. 6, the amplitude distribution pattern of the light degenerates by a greater degree than in the best focus state and results in a pattern as shown in FIG. 7 as the light travess through the projection lens 4 to the wafer 5. Therefore, when the light reflected from the wafer 5 goes upward through the focus test patterns 8 of the mask 3, a substantial quantity of light is blocked by the blocking portions A, as shown in FIG. 8. Thus, a reduced quantity of the light reaches the sensor 7, travelling via the chosen focus test pattern 8 and the half mirror 6.

In short, the quantity of light which reaches the sensor 7 is maximum in the best focus state, and becomes smaller as the state of focus deviates further from the best focus state. Therefore, the best focus position can be easily determined by monitoring the quantity of the light received by the sensor 7 while moving the wafer along the optical axis.

In the next procedure, the half mirror 6 is moved by the driving means 6a to a position directly above another focus test pattern 8 in order to determine the best focus position with respect to the focus test pattern 8. In this way, the best focus positions with respect to all the focus test patterns 8 are determined. Then, using the distribution of the best focus positions, the curvature of the image field of the projection lens 4 is evaluated.

Optionally, a plurality of focus test patterns 8 and a circuit pattern to be projected may be formed on a single mask. Using such a mask, the curvature of the image field of a projection lens 4 can be evaluated while the circuit pattern is being projected. Therefore, it is possible to continuously monitor changes in the curvature of the image field caused by changes in air pressure or temperature, or frequent exposures.

Though the half mirror 6 is placed between the condenser lens 2 and the mask 3 in the above embodiment, the half mirror 6 may be placed any other place as long as it is placed closer to the light source 1 than the mask 3. For example, the half mirror 6 may be placed between the light source 1 and the condenser lens 2.

Though the wafer 5 is used as a reflecting means in the above embodiment, a mirror or the like may be used instead.

Figure 9:
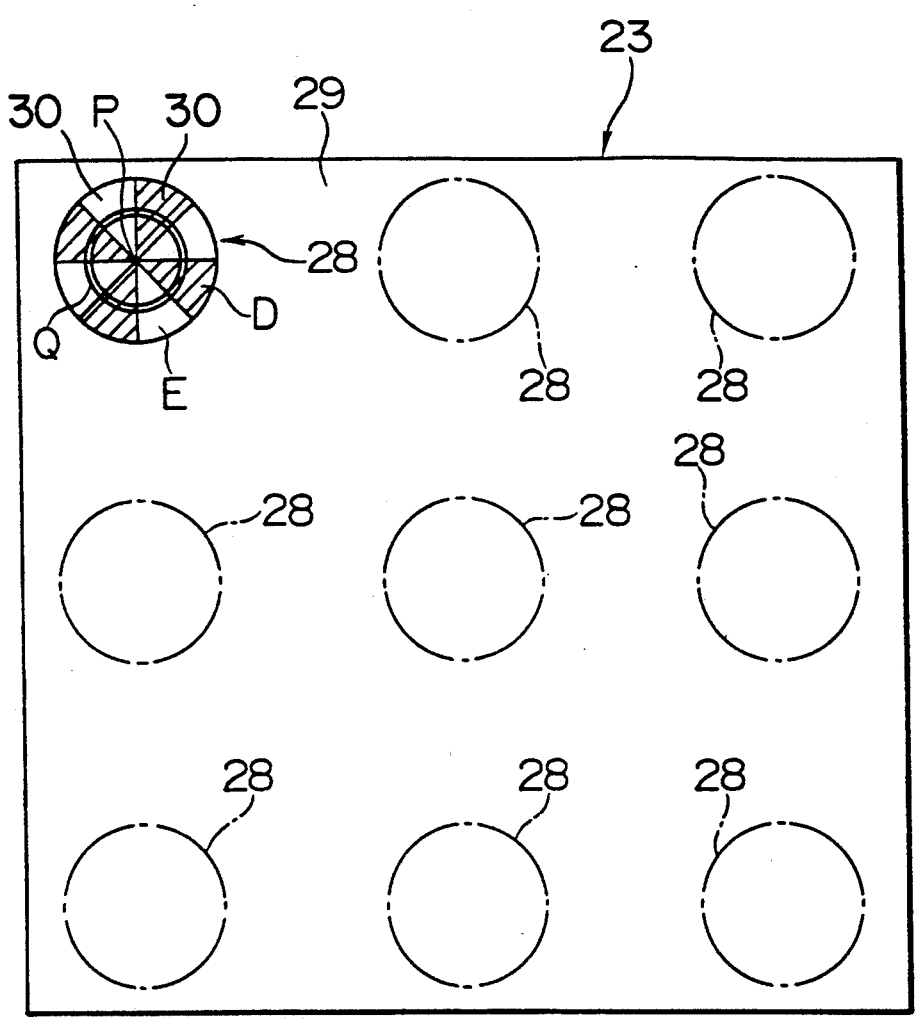
FIG. 9 is a plan view of a mask used in another embodiment.

Further, instead of the mask 3 in the above embodiment, a mask 23 as shown in FIG. 9 may be used. The mask 23 has a transparent substrate 29 and many focus test patterns 28 which are formed on substantially the entire surface of the transparent substrate 29. Each of the focus test patterns 28 has a plurality of light-blocking members 30 which are radially arranged within a sector having an origin p subtending a predetermined angle. Thus, the light-blocking members 30 form a pattern in which light-blocking portions D and light-transmitting portions E are alternatingly arranged.

As in the above-described embodiment, the distribution of the best focus positions is obtained by monitoring with a sensor 7 the quantity of light which has been reflected and transmitted through each focus test pattern 8.

Because the degree of the diffraction depends on the wavelength of light and the size of the individual patterns, the best focus positions can be precisely determined by using focus test patterns in which the pitch of the light-blocking members is substantially the same as the size of the smallest gap in a chip pattern to be projected through a projection lens 4. Accordingly, the use of the focus test patterns 28 shown in FIG. 9 is advantageous. Since the blocking portions D and transmitting portions E are formed in alternatingly in a sector, the pitch along the circumference of a circle about the center P becomes greater as the radius of such a circle is increased. If a focus test pattern 28 is imaged on the light receiving surface of the sensor 7 and a ring portion Q an appropriate distance from the center P in the image of the pattern 28 is used to detect the light quantity, the best focus position with respect to a focus test pattern using a desired pitch can be determined. Thus, the curvature of the image field can be evaluated with high precision.

Figure 10:
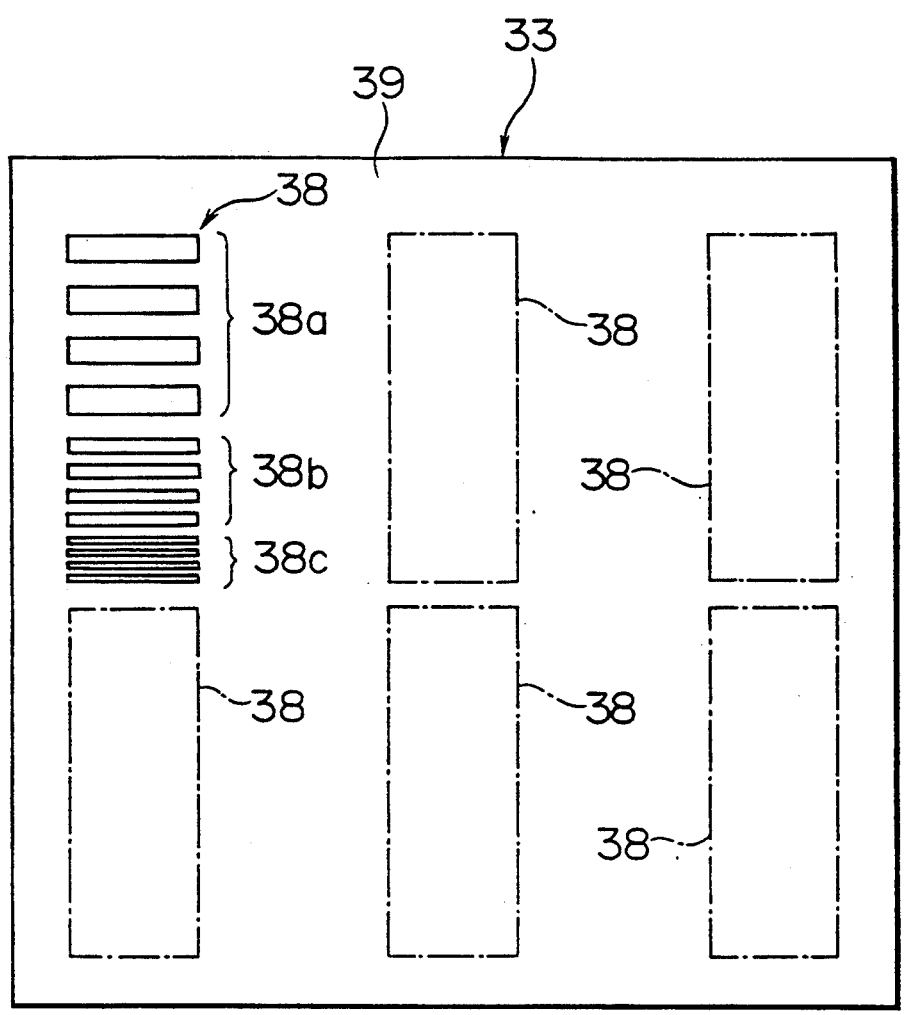
FIG. 10 is a plan view of a mask used in still another embodiment.
Figure 11:
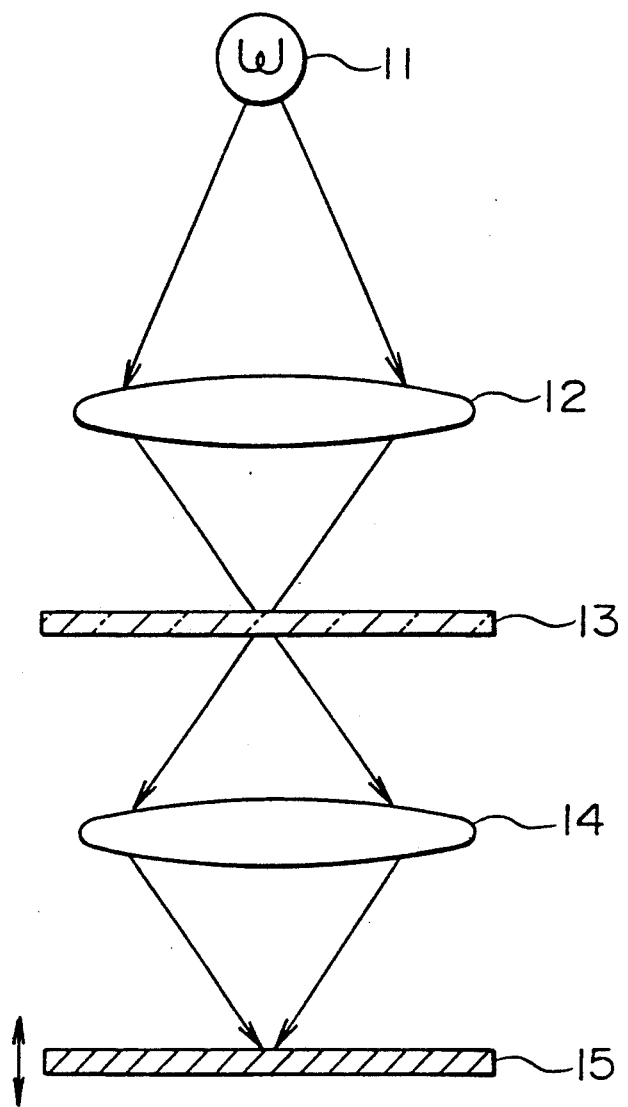
FIG. 11 illustrates the optical system of a known projection-exposure apparatus.
Figure 12:
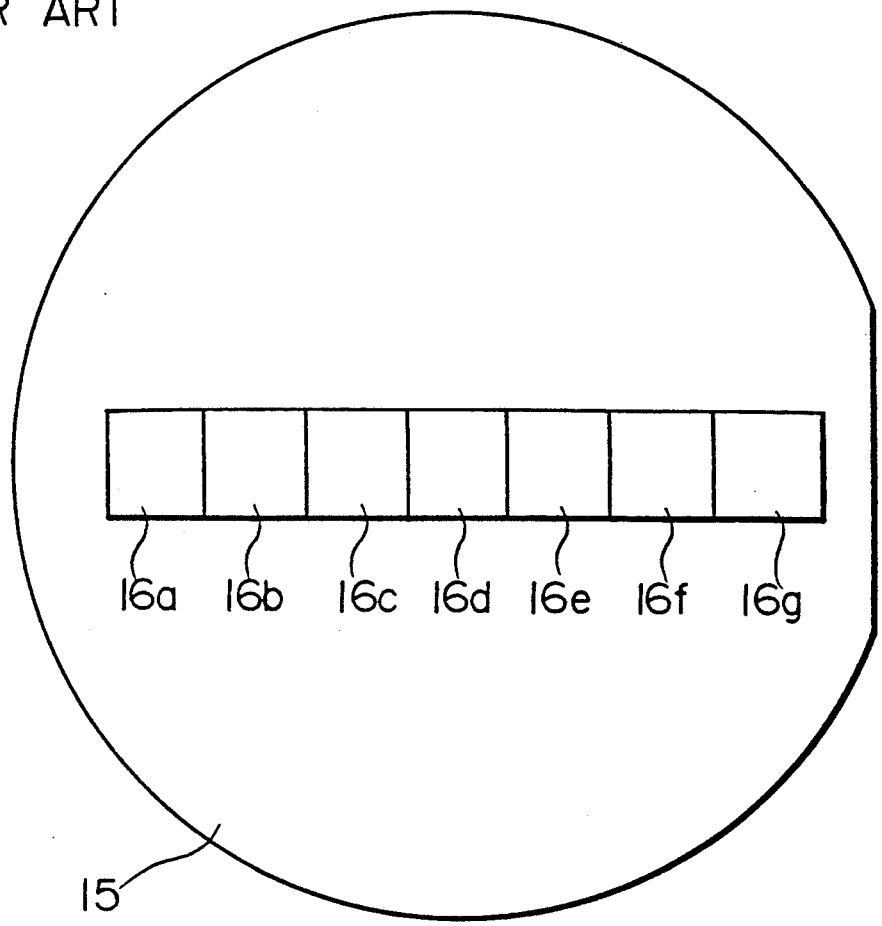
FIG. 12 is a plan view of a wafer, illustrating a test pattern projected thereon by a conventional method of evaluating a projection lens.
Figure 13:
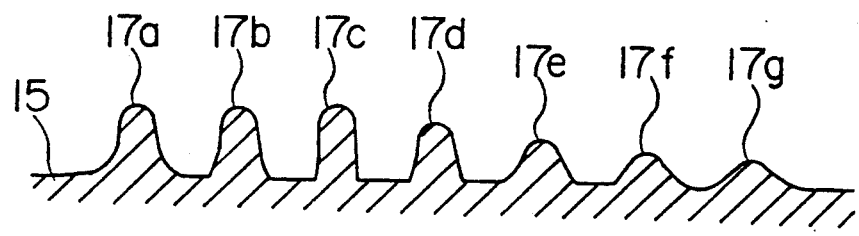
FIG. 13 is a sectional view of a wafer having a test pattern formed thereon.

Further, a mask 33 as shown in FIG. 10 may be used, in which focus test patterns 38 are located on a transparent substrate 39 and each pattern includes a plurality of sub-patterns 38a, 38b and 38c having different pitches. The sub-patterns 38a, 38b and 38c each have a plurality of light-blocking members which are parallel and have respective pitches. A sub-pattern whose pitch is equal or the closest to the pitch of a circuit pattern to be projected is selected from the sub-patterns 38a, 38b and 38c, and the quantity of light transmitted through the selected sub-pattern is detected. Thus, the distribution of the best focus positions can be determined with high precision.

What is claimed is:

1. An apparatus for evaluating a projection lens comprising:
    a light source for emitting light;
    a mask including a plurality of focus test patterns, each test pattern including light-blocking members and light-transmitting portions alternatingly arranged;
    a condenser lens for condensing light emitted from said light source onto said mask so that the light transmitted through the mask strikes a projection lens to be evaluated;
    reflecting means for reflecting the light condensed by said projection lens so that the reflected light strikes the projection lens again;
    a half mirror for reflecting the light transmitted through a focus test pattern selected from said focus test patterns, reflected by said reflecting means, and transmitted by the selected focus test pattern;
    driving means for moving said half mirror along said mask to select one of said focus test patterns; and
    a sensor for detecting the quantity of light reflected from said half mirror.

2. An apparatus for evaluating a projection lens as claimed in claim 1 wherein each of said focus test patterns contains a plurality of rectangular light-blocking members and rectangular light-transmitting portions alternatingly arranged at a selected pitch.

3. An apparatus for evaluating a projection lens as claimed in claim 1 wherein each of said focus test patterns comprises a plurality of sub-patterns containing a plurality of rectangular light-blocking members and rectangular light-transmitting portions alternatingly arranged at respective pitches.

4. An apparatus for evaluating a projection lens as claimed in claim 1 wherein each of said focus test patterns contains a plurality of light-blocking members and light-transmitting portions alternatingly arranged radially within a sector extending from a center and subtending a certain angle.

5. An apparatus for evaluating a projection lens as claimed in claim 1 wherein said reflecting means is a semiconductor wafer.

6. An apparatus for evaluating a projection lens as claimed in claim 1 wherein said reflecting means is a mirror.

7. A method for evaluating a projection lens comprising the steps of:
    irradiating with light the entire surface of a mask having a plurality of focus test patterns, each focus test pattern including light-blocking members and light-transmitting portions alternatingly arranged, the light transmitted through each of said focus test patterns being transmitted through a projection lens, striking and being reflected from a surface, and being transmitted again through said projection lens to the same focus test pattern; and
    finding the distribution of best focus positions by detecting the quantities of light transmitted through said focus test patterns twice.

8. The method for evaluating a projection lens as claimed in claim 7 wherein a mask having a plurality of focus test patterns and a circuit pattern is used as the mask, including simultaneously finding the distribution of best focus positions and exposing the surface to the circuit pattern with the light projected through said mask.

* * * * *